(12) United States Patent
Block et al.

(10) Patent No.: US 7,843,036 B2
(45) Date of Patent: Nov. 30, 2010

(54) ENHANCED ON-CHIP DECOUPLING CAPACITORS AND METHOD OF MAKING SAME

(75) Inventors: Bruce A. Block, Portland, OR (US); Richard Scott List, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 12/190,550

(22) Filed: Aug. 12, 2008

(65) Prior Publication Data

US 2008/0296731 A1  Dec. 4, 2008

Related U.S. Application Data

(62) Division of application No. 10/766,674, filed on Jan. 27, 2004, now Pat. No. 7,416,954, which is a division of application No. 10/185,798, filed on Jun. 27, 2002, now Pat. No. 6,737,699.

(51) Int. Cl.
*H01L 21/00* (2006.01)
(52) U.S. Cl. ........................ 257/532; 257/306; 257/309
(58) Field of Classification Search ................ 257/532, 257/309, 306
See application file for complete search history.

(56) References Cited

U.S. PATENT DOCUMENTS

| | | | |
|---|---|---|---|
| 5,021,842 A | | 6/1991 | Koyanagi |
| 5,142,639 A | * | 8/1992 | Kohyama et al. ........... 257/306 |
| 5,153,813 A | | 10/1992 | Oehrlein et al. |
| 5,206,787 A | * | 4/1993 | Fujioka ........................ 257/307 |
| 5,240,871 A | * | 8/1993 | Doan et al. .................. 438/397 |
| 5,455,204 A | | 10/1995 | Dobuzinsky et al. |
| 5,550,080 A | | 8/1996 | Kim |
| 5,696,395 A | | 12/1997 | Tseng |
| 5,701,264 A | | 12/1997 | Shrivastava et al. |
| 5,710,233 A | | 1/1998 | Meckel et al. |
| 5,716,884 A | | 2/1998 | Hsue et al. |
| 5,753,948 A | | 5/1998 | Nguyen et al. |
| 5,763,286 A | | 6/1998 | Figura et al. |
| 5,789,267 A | | 8/1998 | Hsia et al. |
| 5,835,337 A | | 11/1998 | Watanabe et al. |
| 5,843,822 A | | 12/1998 | Hsia et al. |
| 5,851,897 A | | 12/1998 | Wu |
| 5,879,988 A | | 3/1999 | Chen et al. |
| 5,891,772 A | | 4/1999 | Hsu |
| 5,904,537 A | | 5/1999 | Wu |
| 5,907,774 A | | 5/1999 | Wise |

(Continued)

FOREIGN PATENT DOCUMENTS

KR  2001036045  5/2001

*Primary Examiner*—Laura M Menz
(74) *Attorney, Agent, or Firm*—Blakely, Sokoloff, Taylor & Zafman LLP

(57) ABSTRACT

An apparatus including a capacitor formed between metallization layers on a circuit, the capacitor including a bottom electrode coupled to a metal layer and a top electrode coupled to a metal via wherein the capacitor has a corrugated sidewall profile. A method including forming an interlayer dielectric including alternating layers of dissimilar dielectric materials in a multilayer stack over a metal layer of a device structure; forming a via having a corrugated sidewall; and forming a decoupling capacitor stack in the via that conforms to the sidewall of the via.

6 Claims, 12 Drawing Sheets

U.S. PATENT DOCUMENTS

| | | | |
|---|---|---|---|
| 6,022,772 | A | 2/2000 | Watanabe et al. |
| 6,027,968 | A | 2/2000 | Nguyen et al. |
| 6,064,085 | A | 5/2000 | Wu |
| 6,162,680 | A | 12/2000 | Lou |
| 6,268,995 | B1 | 7/2001 | Beuerman et al. |
| 6,294,420 | B1 | 9/2001 | Tsu et al. |
| 6,344,392 | B1 | 2/2002 | Liaw |
| 6,346,455 | B1 | 2/2002 | Thakur et al. |
| 6,373,092 | B1 | 4/2002 | Okumoto |
| 6,407,423 | B1 | 6/2002 | Okumoto |
| 6,555,433 | B2 | 4/2003 | Liaw |
| 6,660,611 | B2 | 12/2003 | Thakur et al. |
| 6,737,699 | B2 * | 5/2004 | Block et al. ............ 257/306 |
| 6,888,974 | B2 | 5/2004 | Block et al. |
| 6,927,445 | B2 | 8/2005 | Thakur et al. |
| 7,138,678 | B2 * | 11/2006 | Block et al. ............ 257/306 |
| 7,416,954 | B2 * | 8/2008 | Block et al. ............ 438/397 |
| 2004/0002187 | A1 * | 1/2004 | Block et al. ............ 438/238 |
| 2004/0184701 | A1 | 9/2004 | Barnett et al. |
| 2004/0188744 | A1 * | 9/2004 | Block et al. ............ 257/306 |
| 2004/0223681 | A1 | 11/2004 | Block et al. |
| 2005/0259380 | A1 * | 11/2005 | Block et al. ............ 361/306.2 |
| 2008/0296731 | A1 * | 12/2008 | Block et al. ............ 257/532 |
| 2009/0096003 | A1 * | 4/2009 | Zhu ............ 257/309 |

* cited by examiner

ENHANCED ON-CHIP DECOUPLING CAPACITORS AND METHOD OF MAKING SAME

CROSS-REFERENCE TO RELATED APPLICATION

This application is a divisional of U.S. patent application Ser. No. 10/766,674, filed Jan. 27, 2004 now U.S. Pat. No. 7,416,954, which is a divisional of Ser. No. 10/185,798, filed Jun. 27, 2002 now U.S. Pat. No. 6,737,699, issued May 18, 2004.

BACKGROUND

1. Field

An integrated circuit decoupling capacitor and more specifically, an on-chip decoupling capacitor.

2. Background

The operation of low power, high speed integrated circuits can be affected by the electrical noise generated by the continuous switching of the transistors located in the circuit. It is well known that the inductive noise of an integrated circuit can be reduced by connecting decoupling capacitors to the circuit. Decoupling capacitors placed on power-consuming circuits are able to smooth out voltage variations with the stored charge on the decoupling capacitor. The stored charge is used as a local power supply to device inputs during signal switching stages, allowing the decoupling capacitor to mitigate the effects of voltage noise induced into the system by parasitic inductance.

Typically, a decoupling capacitor is placed in the same package as the chip. Unfortunately, this arrangement is costly to manufacturer, and the long lead lines from the power-consuming circuit to the capacitor electrodes contributes a substantial inductance. Such off-chip decoupling capacitors, however, are not sufficient for very high speed microprocessor applications. The voltage drop across an inductor may be described by the relationship L di/dt, where L is inductance and di/dt represents the change in current through a circuit over a period of time. Implicit in the di/dt is a frequency component (omega), so as frequency goes up, inductance becomes more and more a factor for power distribution. The frequency dependent L di/dt voltage drop makes the off-chip capacitors generally unusable with gigahertz switching circuits unlike low frequencies for which voltage drops are dominated by resistance.

Some efforts have been made to integrate decoupling capacitors as part of the gate dielectric processing step. A portion of the active silicon area is used to deposit the gate dielectric for use as a decoupling capacitor. An advantage to this is that there are no additional processing steps involved with it. Disadvantages include the decoupling capacitor takes up high-value real estate on the chip as the capacitors compete for valuable chip area that could be used for building additional circuits. Also the capacitor made with a gate oxide designed for very high transistor performance generally has a great deal of leakage. These gate decoupling capacitors also generally have associated parasitic resistance from the relatively low silicon conductivity that entails an additional resistance-capacitance (RC) time constant for charge extraction. Although it is possible to integrate gate capacitors within the chip's circuit elements, due to the limited area in which to build these capacitors, the overall capacitive decoupling that they provide is also limited.

Another approach to decoupling capacitor fabrication is a decoupling capacitor that may be fabricated between metal layers in an integrated circuit. In a representative chip architecture having seven metal layers, for example, the capacitor may be fabricated between metal six (n–1) layer and metal seven (n) layer. Advantages to this embodiment include that there is little no additional real estate (area) on the chip consumed for fabrication of the decoupling capacitor, and the decoupling capacitor directly bridges the on-chip power grid being representatively up to 10 microns, according to current technologies, from the integrated circuit element it is supporting with a very low inductance per unit length due to the tight spacing of the power and ground lines. One problem with locating the decoupling capacitor between metal layers is that, in the example given, approximately 30 percent of the metal six layer is devoted to power supply. This limits the total amount of decoupling capacitance that can be provided on-chip per layer, because total capacitance available is generally a function of the total area dedicated to capacitor plates.

BRIEF DESCRIPTION OF THE DRAWINGS

Various embodiments are illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Figure 1:
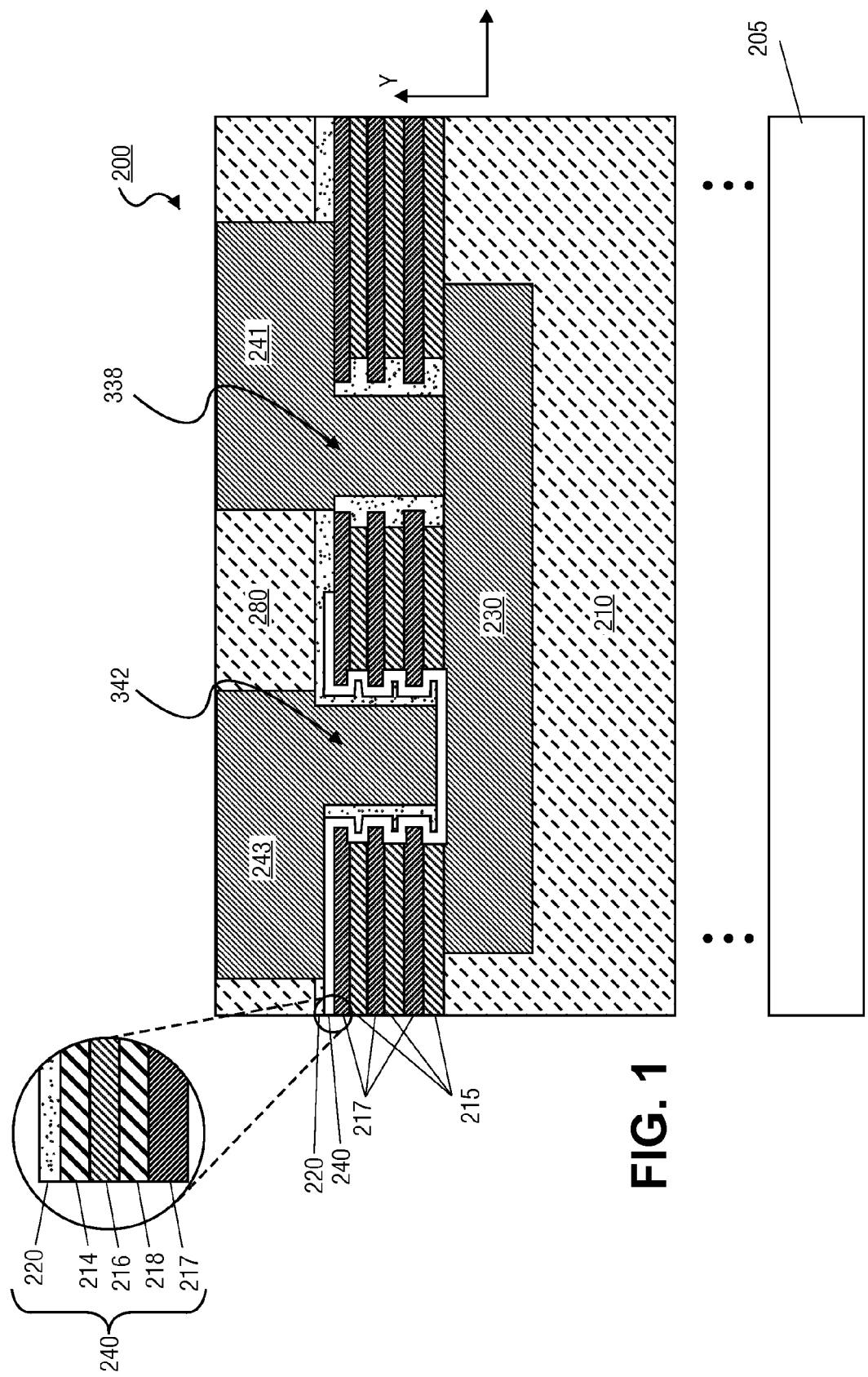
FIG. 1 is a cross-sectional schematic illustration of one embodiment of a corrugated conformal decoupling capacitor stack.

FIG. 1 is a cross-sectional schematic illustration of one embodiment of a portion of a die or chip having at least one corrugated stacked capacitor between conductors. Structure 200 includes substrate 205 that is, for example, a semiconductor substrate or a semiconductor film having devices formed thereon. Overlying substrate 205 are typically multiple conductive (e.g., "metal") layers (e.g., seven metal layers) that serve or reference (e.g., power/ground) to link various devices on substrate 205. The metal layers are patterned into one or more "lines" at each level. Substrate 205 and the metal layers or lines are typically isolated from one another by dielectric material layers, referred to as interlayer dielectric (ILD) material.

Interlayer dielectric 210 and interlayer dielectric layer 280 generally refer to the various ILD material layers that electrically isolate the various structural elements on substrate 205 circuit from one another while providing mechanical support for various elements that might be associated with the metal lines. In one embodiment, metal line 230 (e.g., metal layer six) is shown making direct contact to metal line 241. This direct contact is made through via 338. Metal line 243 is connected to metal line 230 through via 342. Vias 342 and 338 are formed in a dielectric material layer comprising, in one example described herein, alternating layers of dielectric materials having dissimilar etch rates.

Referring to FIG. 1, alternating layers of dielectric materials 215 and 217 are shown stacked in on metal line 230, and as is shown here allowing access to metal line 230 from metal lines 243 and metal line 241. Alternating layers of dielectric material 217 and 215 having dissimilar etch rates are shown having different widths (x direction widths as viewed) within vias 342 and 338. The different widths of alternating layers of dielectric materials 217 and 215 produce a corrugation in the vertical surfaces of vias 342 and 338.

It is to be understood that although FIG. 1 is a two dimensional drawing, the drawing represents a three dimensional figure. Thus, in various embodiments vias 342 and 338 may be circular, square or rectangular. Vias 342 and 338 thus define an opening in dielectric materials 217 and 215. The corrugated surface of vias 342 and 338 may therefore be on all vertical sides of the interior surface of the via (e.g., different x and z direction widths). The corrugations of alternating layers of dielectric materials 217 and 215 within vias 342 and 338 increase the surface area of the vertical surface of vias 342 and 338.

FIG. 1 also shows a decoupling capacitor formed in and around via 342. Decoupling capacitor stack 240 includes (as viewed in the inset) top electrode 214, dielectric material 216 and bottom electrode 218. Referring to FIG. 1, decoupling capacitor stack 240 fills the surface area of via 342, and in one embodiment covers, as viewed, the top of uppermost alternating layer of dielectric material, in this example dielectric material 217. Decoupling capacitor stack 240 is conformally formed on the vertical surfaces of via 342. As a result of the corrugated configuration of via 342, the total capacitive area of the decoupling capacitor stack is increased as compared to capacitors formed in a linearly-edged via.

Passivation layer 220 shown in FIG. 1 covers the exposed surface of decoupling capacitor stack 240 and alternating layers of dielectric materials 217 and 215. A conductive material, such as tungsten or copper fills each of via 338 and via 342 to couple metal line 241 and metal line 243, respectively, to metal line 230. Via 342 makes a decoupled connection between metal line 230 and metal line 243. In one embodiment, metal line 241 represents a $V_{CC}$, and metal line 243 represents a $V_{SS}$ metal line.

Figure 2:
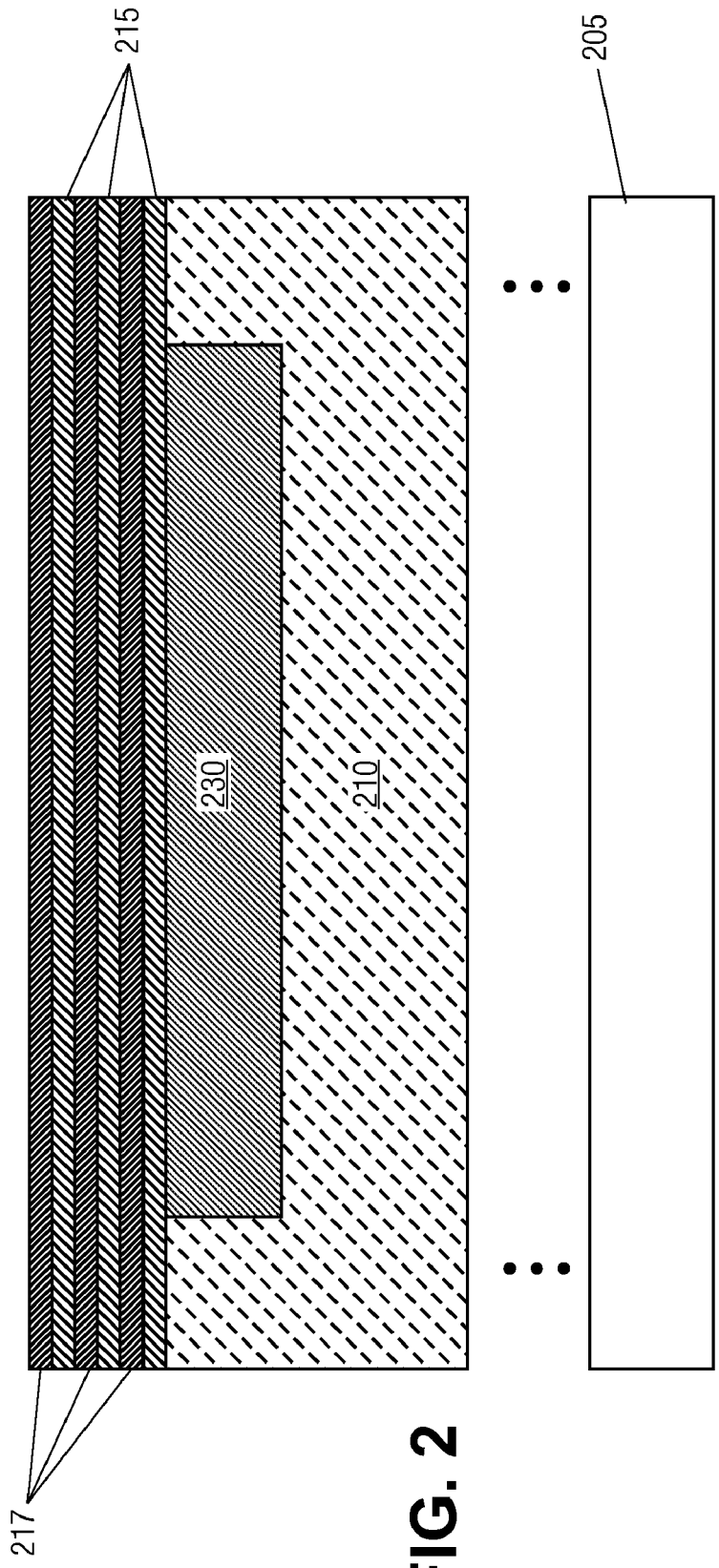
FIG. 2 is a cross-sectional schematic illustration of one embodiment of a substrate having an interlayer dielectric of alternating layers of dielectric material.
Figure 12:
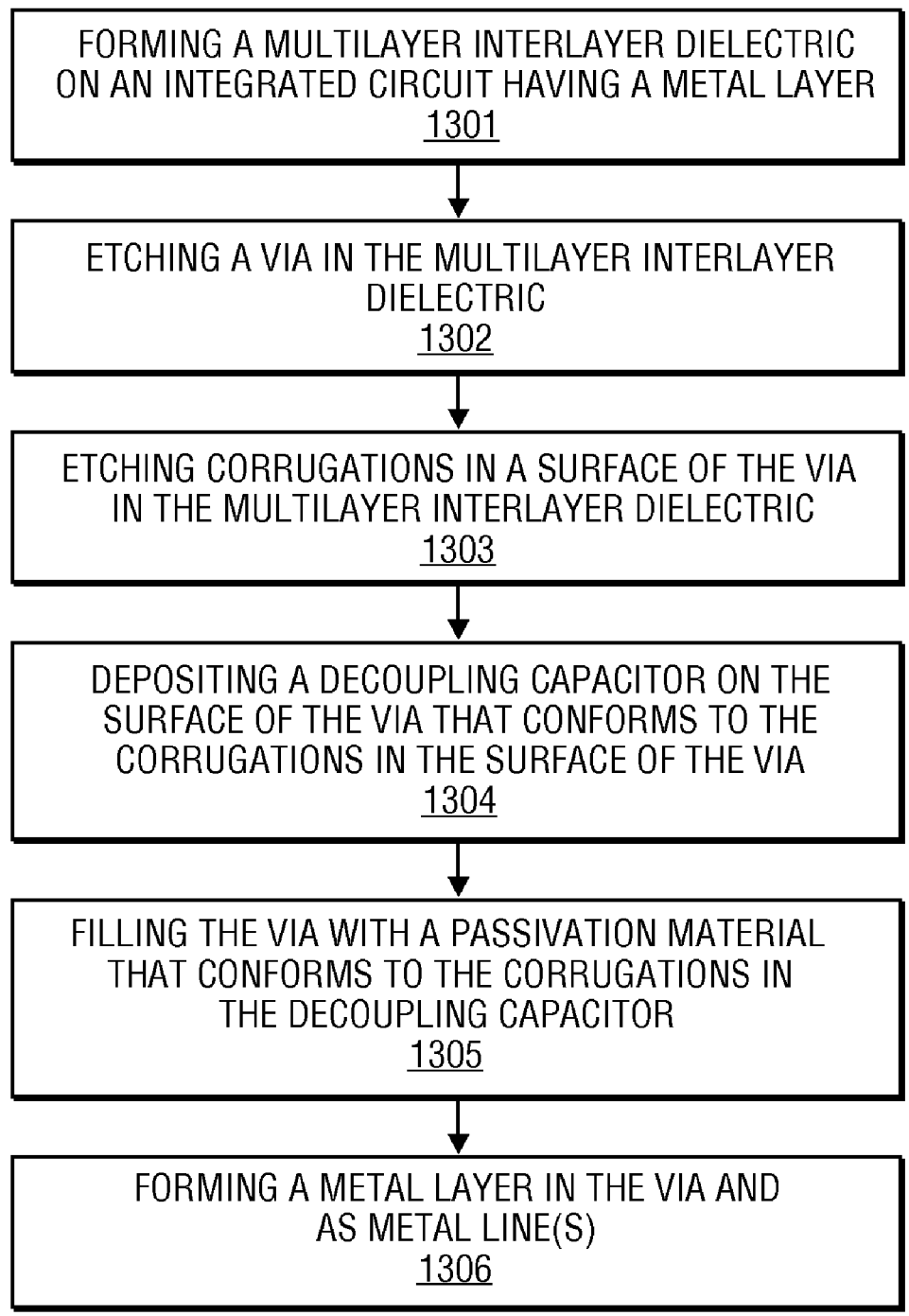
FIG. 12 is a flow diagram representing one method of fabricating the structure according to FIG. 2 to FIG. 9.

FIGS. 2-9 show one technique for forming the structure illustrated in FIG. 1. FIG. 12 is a flow chart representing a flow scheme described with reference to FIGS. 2-9. FIG. 2 shows metal line 230 resting on and in interlayer dielectric 210 on substrate 205. A top surface of metal line 230 and interlayer dielectric 210 may be planarized (e.g., by way of a chemical-mechanical polish) to achieve a uniform smoothness. Alternating layers of dielectric materials 215 and 217 are deposited on a surface of metal line 230 and interlayer dielectric 210 (FIG. 12, block 1301). The number of alternating layers of dielectric materials 215 and 217 is determined by the design parameters of the circuit. For instance, an increased stack height (e.g., more dielectric layers) tends to increase decoupling capacitance. However, increasing stack also tends to increase the capacitance for signal lines and increase delay. In the embodiment illustrated, there are three alternating layers of dielectric materials. The first deposited layer is a layer of dielectric material 217 and the final deposited layer is a layer of dielectric material 215. Dielectric material 217 and dielectric material 215, in one embodiment, having dissimilar etch characteristics at least for a particular etch chemistry. Representatively, dielectric material 217 and dielectric material 215 are selected such that for a selected etch chemistry, one material may be etched to the exclusion of the other or at a rate significantly greater than the other. In one embodiment, layer of dielectric material 217 may be a layer of silicon nitride ($Si_3N_4$) and layer of dielectric material 215 may be a layer of silicon oxide ($SiO_2$) deposited respectively by chemical vapor deposition.

Figure 3:
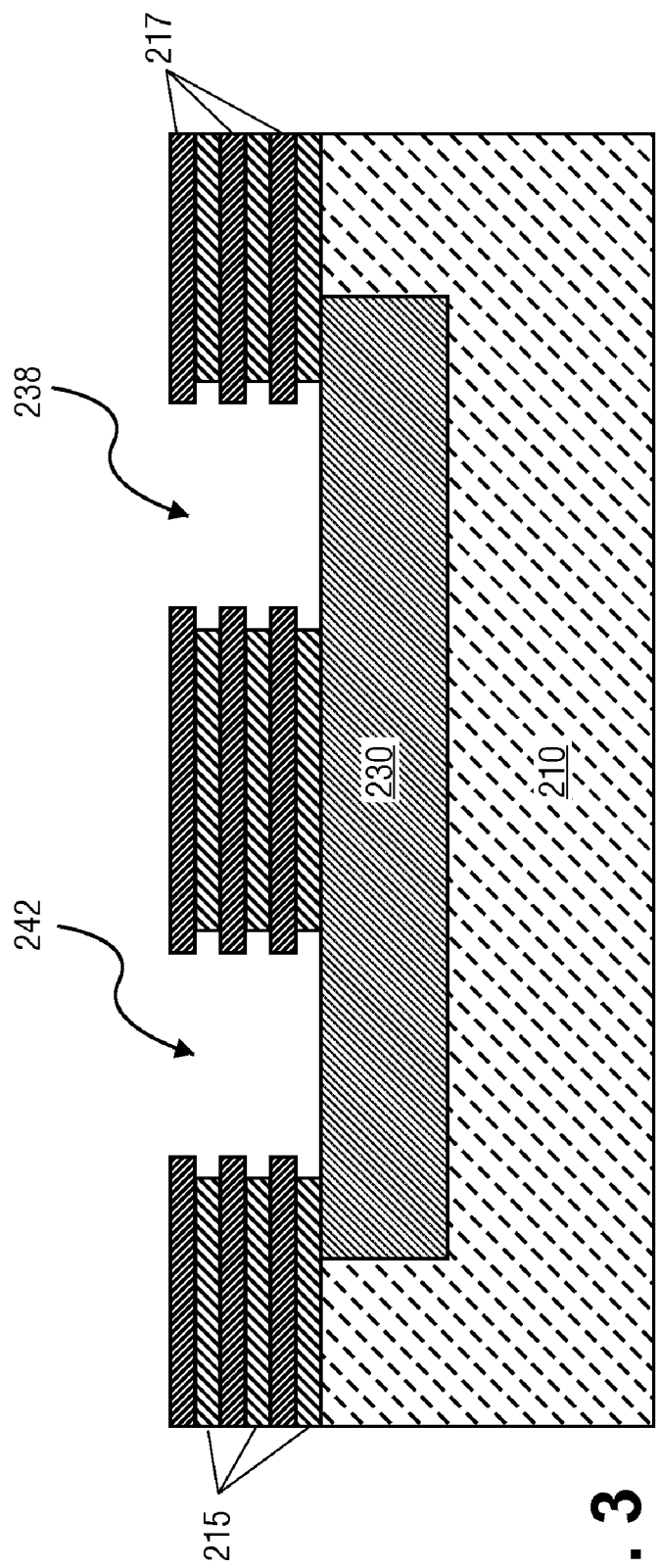
FIG. 3 is a cross-sectional schematic illustration of the structure of FIG. 2 having corrugated vias in the interlayer dielectric layer.

FIG. 3 is a cross-sectional schematic illustration of the structure of FIG. 2 following, in one embodiment, forming corrugated vertical surface vias in alternating layers of dielectric materials 215 and 217. Alternating layers of dielectric material 215 and 217 are etched with an anisotropic vertical etch to create a via hole to metal line 230 in this view (FIG. 12, block 1302). In one embodiment (where dielectric material 217 is $Si_3N_4$ and dielectric material 215 is $SiO_2$), this vertical anisotropic etch may be performed by an $O_2/CH_3$ plasma etch. The etch rate is on the order of about 2:1 ($SiO_2:Si_3W_4$). After anisotropically etching the vias into formation, an isotropic etch may then be used to form the corrugations in the vertical services of the vias resulting in corrugated vias 238 and 242 (FIG. 12, block 1303). The isotropic etch has differential etch rates depending on which material it desired to etch. In a buffered hydrofluoric acid liquid etch, the selectivity of the silicon nitride and the silicon oxide etch ratios will be approximately 100 to one. That is the silicon oxide will etch a 100 times faster then the silicon nitride in the buffered hydrofluoric acid. Thus, layers of dielectric material 215 would etch more rapidly then layers of dielectric material 217 to form the corrugations or wider lateral openings in dielectric material 215 than dielectric material 217 as shown in FIG. 3. One etch system that would provide this differential etch rate would be buffered hydrofluoric acid (HF).

Figure 4:
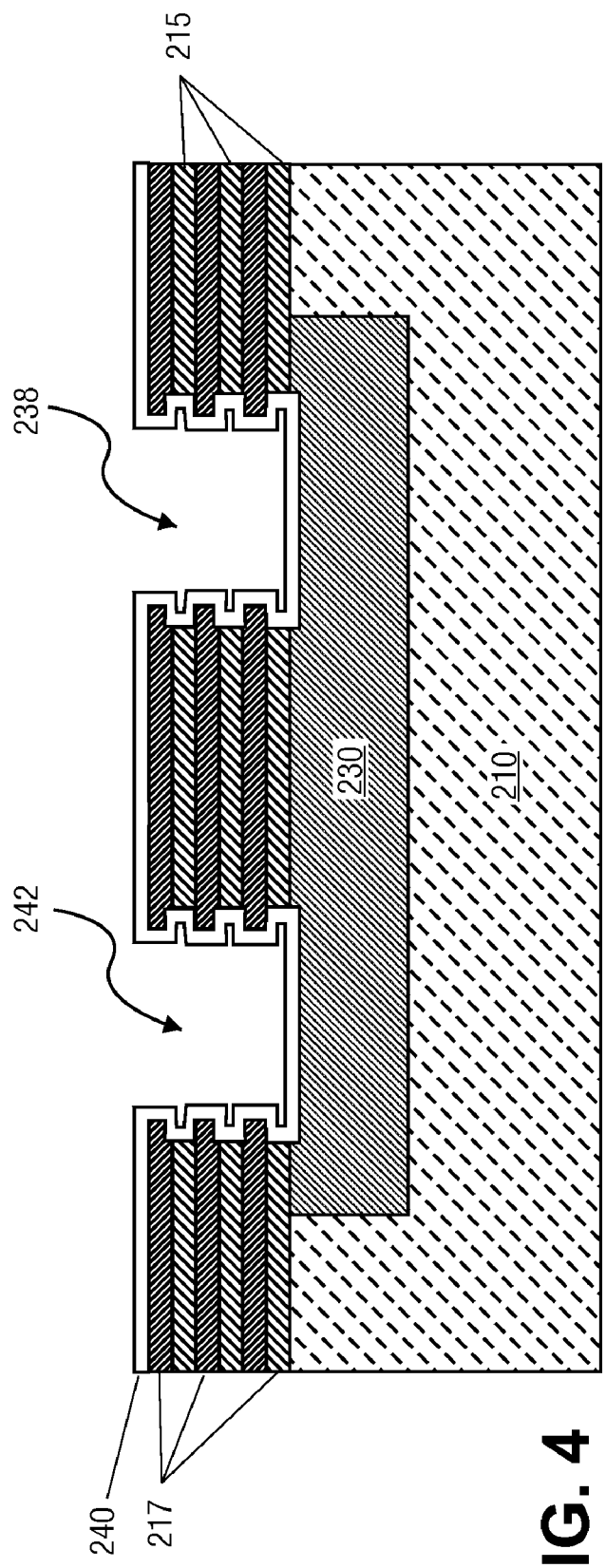
FIG. 4 is a cross-sectional schematic illustration of the structure of FIG. 3 having a conformal decoupling capacitor stack formed thereon.

FIG. 4 is a cross-sectional schematic illustration of the structure of FIG. 3 following, in one embodiment, deposition of decoupling capacitor stack 240 (FIG. 12, block 1304). As is shown in FIG. 1, decoupling capacitor stack 240 comprises top electrode 214, dielectric (capacitive) material 216 and bottom electrode 218. Decoupling capacitor stack 240 is deposited, in this embodiment, such that each layer of the stack conforms to all of the surfaces presented for deposition including the corners and edges of corrugated vertical surfaces in vias 238 and 242.

In one embodiment, decoupling capacitor stack 240 may be deposited by atomic layer chemical vapor deposition (ALCVD) in a processing chamber. In one embodiment, bottom electrode 218 of capacitor stack 240 is deposited first and may be made from either titanium nitride (TiN) or tantalum nitride (TaN) at a thickness on the order of 100 Å. ALCVD processes deposit one atomic layer at a time, therefore, exposed surfaces would be saturated with one chemical constituent either tantalum (Ta), titanium (Ti) or nitrogen (N) in an environment which would allow that constituent to bond to the exposed surface layer. The excess of that original constituent would then be swept away, for example, by a gas flow. The chemical composition of the chamber would then be altered to deposit the second constituent of the binary compound (e.g., TiN or TaN) on the monolayer of the first constituent, in this case nitrogen. These alternating atomic layers of metal and nitrogen would continue to be deposited until a sufficient thickness of TiN or TaN is formed on all exposed surfaces of integrated circuit structure 200.

To form a titanium nitride (TiN) layer, a precursor chemistry of titanium chloride ($TiCl_4$) is used to saturate the surface. The $TiCl_4$ would be cracked to produce two chlorine molecules ($Cl_2$) which leave the exposed surface of the structure and exit the chamber through an exhaust, and one titanium (Ti) atom which bonds the surface. As long as there is surface free of Ti, the Ti continues to deposit. Once the surface is saturated with Ti, deposition ceases. Ti tends not to deposit on Ti. The surface is then ready for deposition of nitrogen.

Ammonia ($NH_3$) is saturated over the exposed Ti surface. The ammonia cracks to produce nitrogen (N) atoms which bond to the Ti surface and hydrogen ($H_2$) gas which leaves the surface and exits through the chamber's exhaust. Once the Ti surface is saturated with nitrogen, the nitrogen deposition tends to cease. This process is repeated until the TiN layer is sufficiently thick, for example, on the order of 100 Å.

When bottom electrode 218 has been deposited to satisfactory thickness, dielectric material 216 is then deposited on bottom electrode 218. In one embodiment, dielectric material 216 is tantalum pentoxide ($Ta_2O_5$). Tantalum pentoxide like bottom electrode 218 would be deposited one element at a time. In one embodiment, the first element to be deposited would be tantalum (Ta) and the surface would be saturated with tantalum in such condition as to allow the tantalum to bond to bottom electrode 218. The precursor would be tantalum ($TaCl_5$) pentachloride. The excess $TaCl_5$ is then swept away and a saturating layer of oxygen (O) is deposited on the monolayer of tantalum. The oxygen precursor may be water ($H_2O$). This process would repeat itself until sufficient thickness of tantalum pentoxide is deposited uniformly on all exposed areas of bottom electrode 218. In one embodiment, a thickness of dielectric material 216 of tantalum pentoxide is on the order of 50 angstroms (Å).

Once sufficient thickness of dielectric material 216 is deposited on bottom electrode 218, top electrode 214 is deposited on dielectric material 216. A suitable material for top electrode 214 includes, but is not limited to, titanium nitride or tantalum nitride. In such example, the deposition would proceed similar to that of bottom electrode 218. Alternating layers of the tantalum or titanium and nitrogen would proceed until sufficient thickness of top electrode 214 had been deposited forming coupling capacitor stack 240. A representative thickness of top electrode 214 is on the order of 100 Å.

Figure 5:
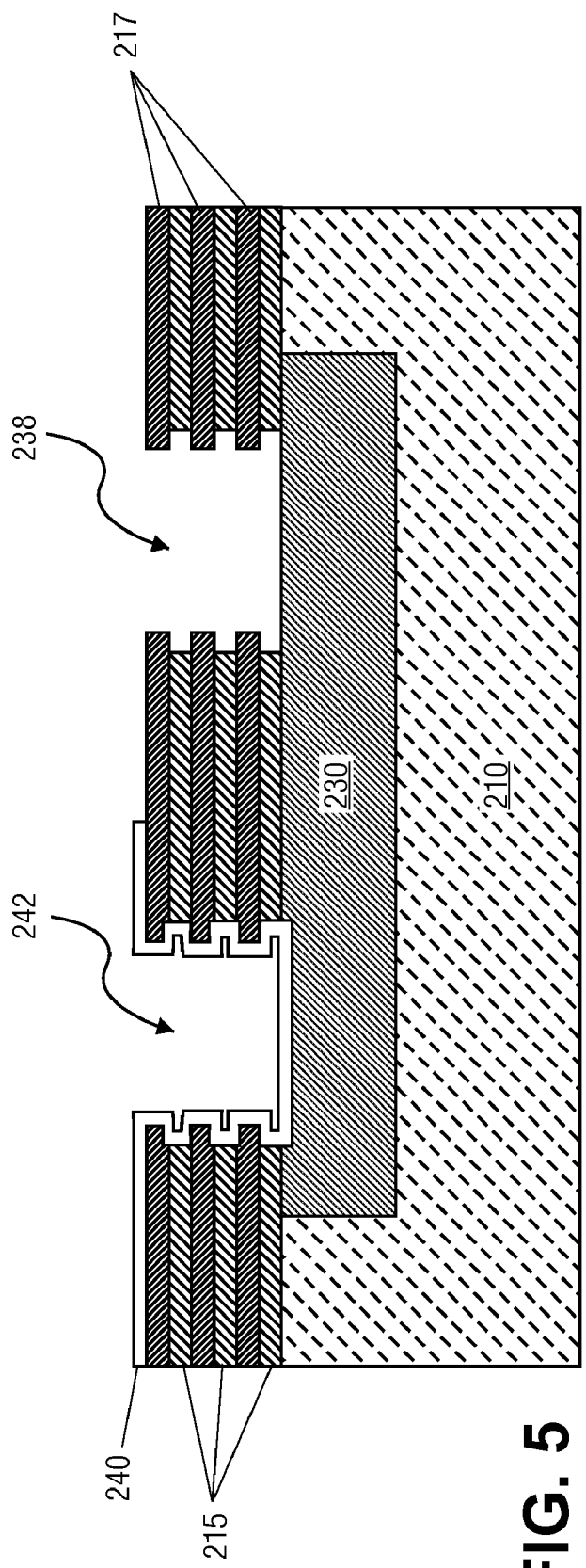
FIG. 5 is a cross-sectional schematic illustration of the structure of FIG. 4 with a conformal capacitor stack in a selected via.

FIG. 5 is a cross-sectional schematic illustration of the structure of FIG. 4 following, in one embodiment, the removal of capacitor stack 240 from via 238. In this example, via 242 has decoupling capacitor stack 240 fabricated therein while via 238 allows for direct metallic contact to metal line 230. Decoupling capacitor stack 240 is removed from those areas of structure 200 where its presence is not desired. One way to remove capacitor stack material is through a photolithographic process to expose the material desired to be removed and etching with a suitable chemistry or chemistries to remove the capacitor stack material.

Figure 6:
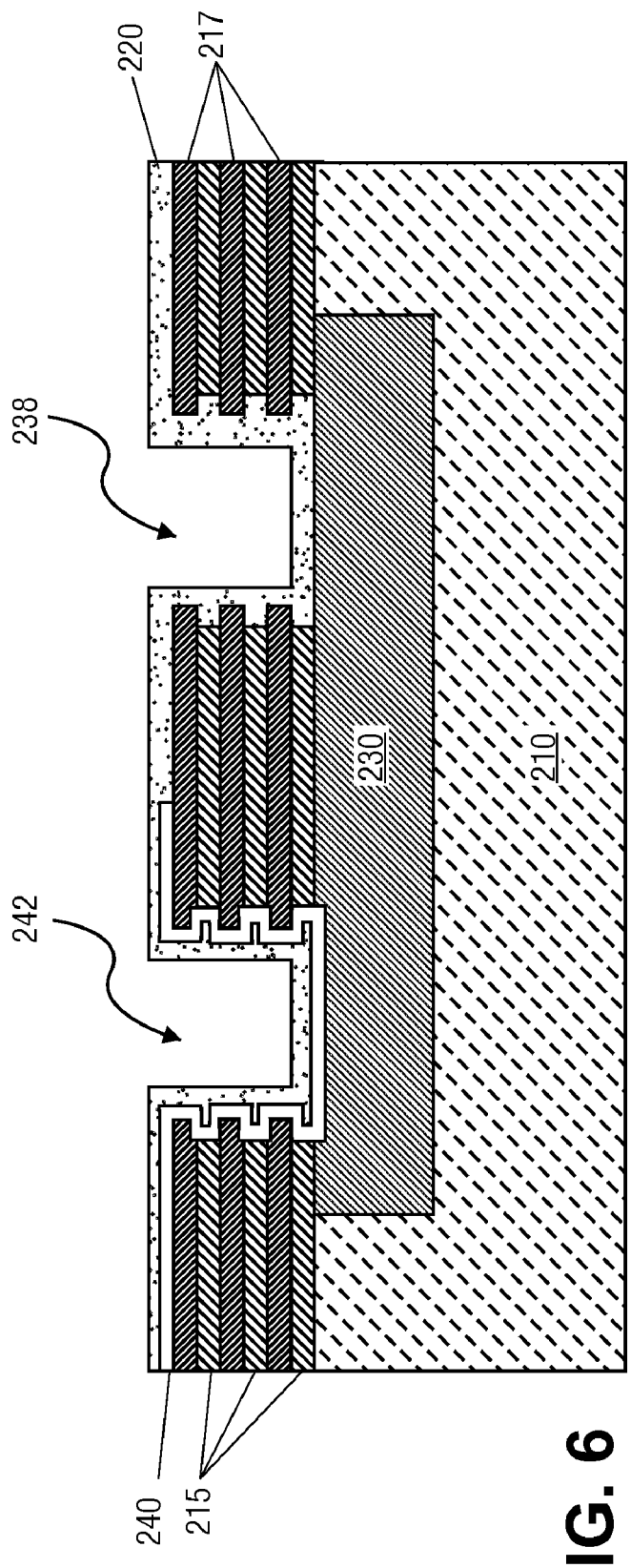
FIG. 6 is a cross-sectional schematic illustration of the structure of FIG. 5 with a passivation layer formed on the structure.

FIG. 6 is a cross-sectional schematic illustration of the structure of FIG. 5 following the passivation of the surface of the structure. In this example, passivation layer 220 of a dielectric material such as silicon nitride ($Si_3N_4$) is deposited over the exposed surfaces and conforms to the corrugations of via 238 and any corrugations remaining in via 242 with the capacitor stack 240 (FIG. 12, block 1305).

Figure 7:
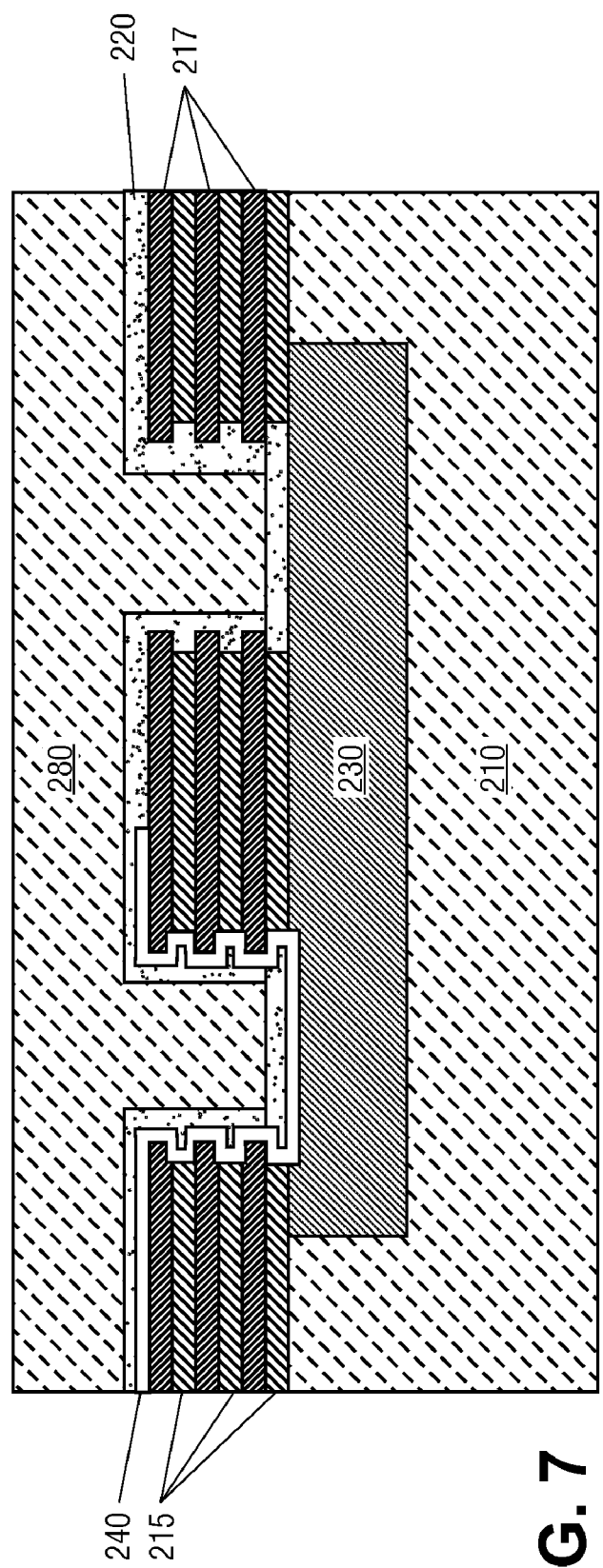
FIG. 7 is a cross-sectional schematic illustration of the structure of FIG. 6 with a blanket passivation formed on the structure.

FIG. 7 is a cross-sectional schematic diagram of the structure of FIG. 6 following introduction of interlayer dielectric layer 280. In one embodiment, interlayer dielectric layer 280 is deposited (e.g., by chemical vapor deposition) over the entire structure. A suitable dielectric material for interlayer dielectric layer 280 is $SiO_2$ deposited to a layer thickness on the order of 1 micron. Following deposition, the superior (as viewed) exposed surface of interlayer dielectric 210 may be planarized such as by a chemical-mechanical polish.

Figure 8:
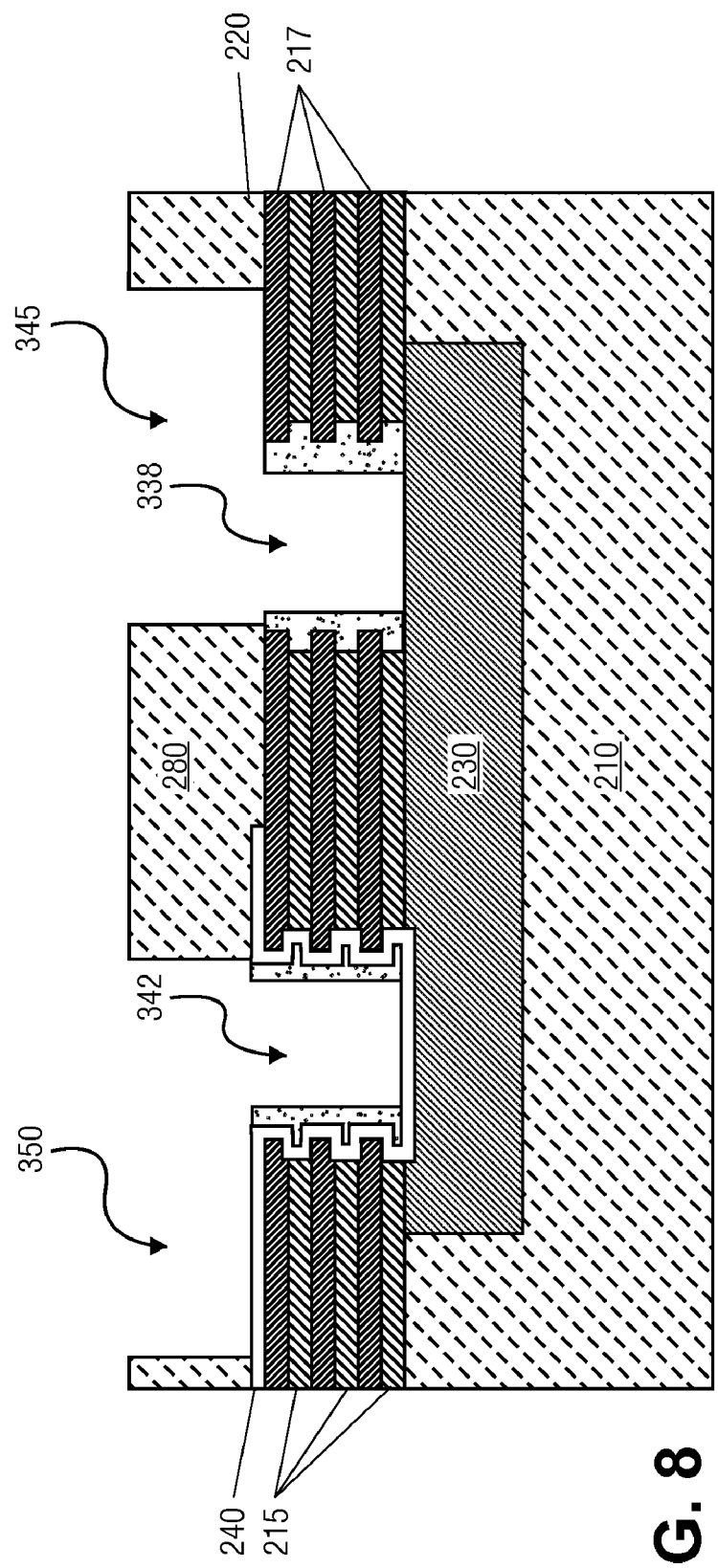
FIG. 8 is a cross-sectional schematic illustration of the structure of FIG. 7 with vias and trenches formed therein.

FIG. 8 is a cross-sectional schematic illustration of the structure of FIG. 7 following the formation of vias and trench openings (e.g., when following a Damascene process) in interlayer dielectric layer 280. Vias 338 and 342, respectively, are formed, for example, by photolithographic and etch processes, in areas at least partially aligned, in this example, with via 238 and via 242, respectively (see, e.g., FIG. 6). Trenches 345 and 350 are etched into interlayer dielectric layer 280 to a depth suitable for a portion of a metallization layer or line. Via 342 defines an opening through a interlayer dielectric layer 280 to decoupling capacitor stack 240. Via 338 forms an opening to metal line 230.

Figure 9:
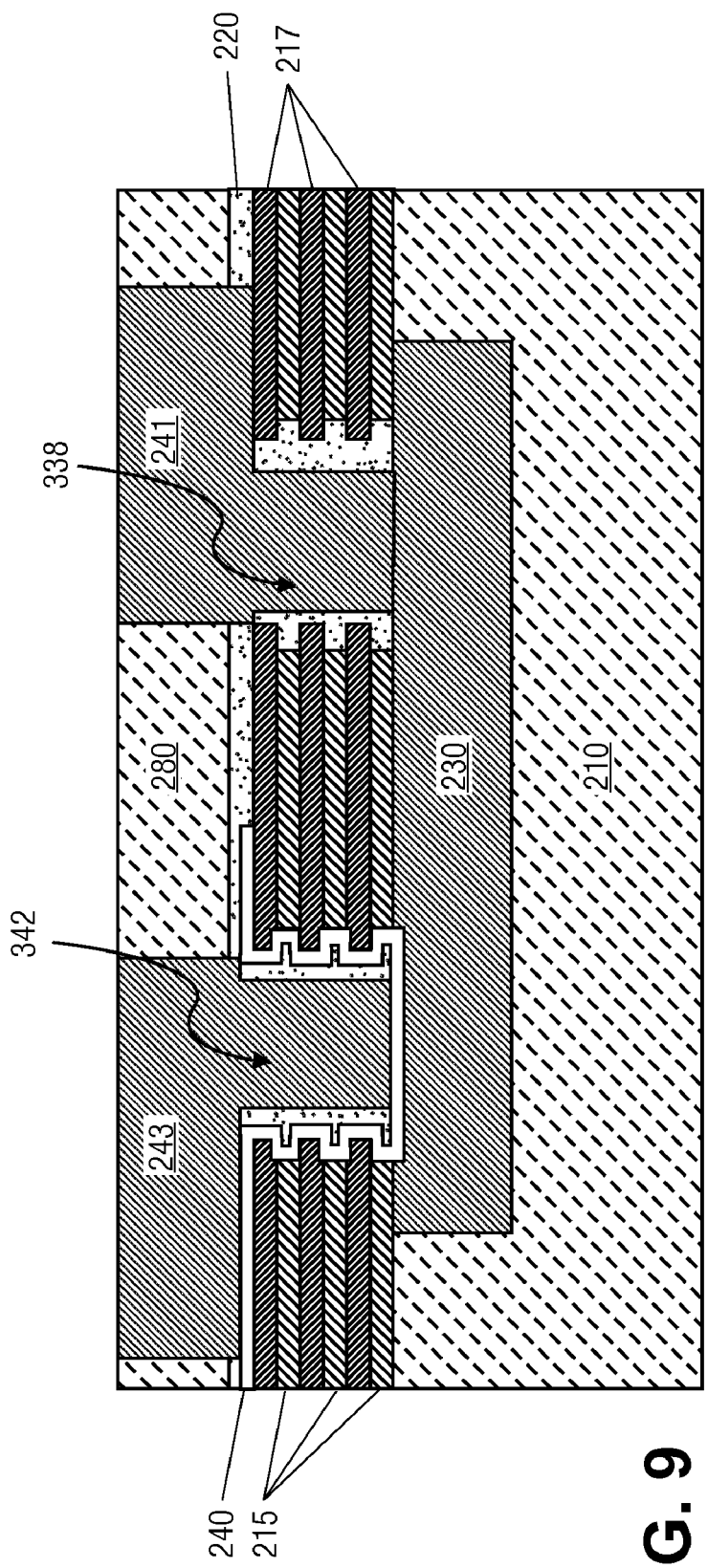
FIG. 9 is a cross-sectional schematic illustration of the structure of FIG. 8 with a via metal and a metal layer formed on the structure.

FIG. 9 is a schematic cross-section illustration of the structure of FIG. 8 following the introduction of conductive (e.g., metal) material to form metal lines 243 and 240 (FIG. 12, block 1306). A suitable material in the described process is copper or a copper alloy. It is appreciated that vias 338, 342 and trench 345, 350 may first be lined with one or more barrier materials. Metal line 243 forms a decoupling contact with metal line 230 through decoupling capacitor stack 240 by way of conductive via 342. Metal line 241 makes a direct metallic contact to metal line 230 through conductive via 338. In the embodiment where metal line 230 is a $V_{CC}$ line, metal line 241 is a $V_{CC}$ transmission line, and metal line 243 may be a $V_{SS}$ transmission line. Metal line 243 also contacts decoupling capacitor stack 240. This configuration tends to improve strapping (or lower resistance) of the electrode (e.g., top electrode as viewed).

A metallization process that is sometimes referred to as a full Damascene process has been described in relation to forming a metal layer or line. Various other embodiments contemplate among other possible processes, including a partial Damascene process whereby a plug (e.g., tungsten plug) is formed in a via and a copper material is deposited in a trench in an interlayer dielectric, or formation of a conductive via in an interlayer dielectric material and depositing and patterning metal lines (e.g., an aluminum or aluminum alloy material) on a surface of the interlayer dielectric.

Figure 10:
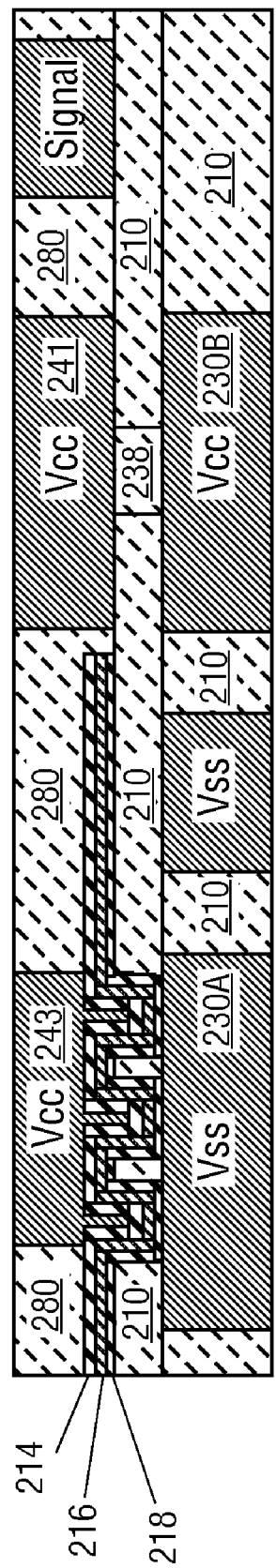
FIG. 10 is cross-sectional schematic illustration of one embodiment of an alternate embodiment of a decoupling capacitor stack.

FIG. 10 is a cross-sectional schematic illustration of a contemplated embodiment of the structure formed according to FIGS. 2-9. In this embodiment, metal line 230A, a $V_{SS}$ line, is decouply connected to metal line 243 which is a $V_{CC}$ line via the decoupling capacitor stack 240 (including top electrode 214, dielectric material 216 and bottom electrode 218). Multiple vias are etched through interlayer dielectric 210 placed over metal line 230A and the decoupling capacitor stack is conformally deposited within these vias. Metal line 230B and metal line 241 define a $V_{SS}$.

Figure 11:
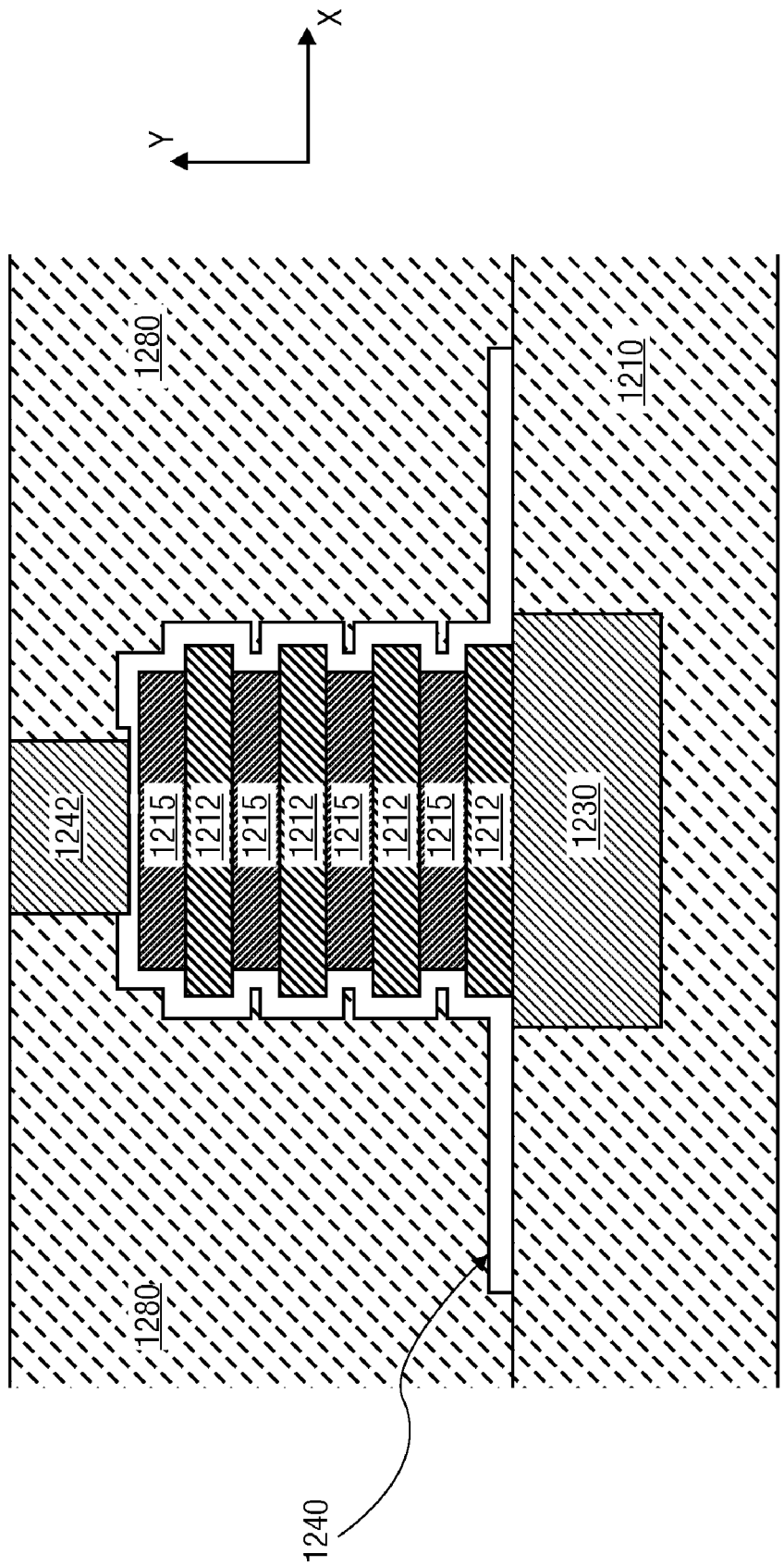
FIG. 11 is a cross-sectional schematic illustration of another embodiment of a corrugated capacitor stack decoupling capacitor.

FIG. 11 is a cross-sectional schematic illustration of one embodiment of an enhanced area vertical decoupling capacitor stack. A series of alternating metal depositions are formed in via 1252 on metal line 1230. In one embodiment, metal layers 1212 comprise a metal while metal layers 1215 comprise a metal nitride compound. The metal/metal nitride compound may consist of tantalum or titanium/tantalum nitride or titanium nitride. Layers 1212 and 1215 are deposited and patterned of altering widths (x and z direction widths) with, in this example, layers 1215 being wider in an x-direction than layers 1215. Layers 1212 and 1215 may be patterned in this manner by photolithographic and etch techniques. By using different materials for layer 1212 and layer 1215, the layers may be selectively patterned. Once the alternating metal nitride via stack is deposited to a sufficient thickness, a differential etch is used to create the corrugations in the side of the stack. Decoupling capacitor stack 1240 is then conformally deposited on the surface of the stack, including on the corrugated surface of the stack. Interlayer dielectric layer 1280 is deposited to surround the stack and the capacitor and a via is etched through interlayer dielectric layer 1280 to allow placement of via metal 1242.

Table 1 illustrates the enhancement of capacitive area in a decoupling capacitor using a corrugated surface structures such as described herein. Column one in Table 1 describes the number of layers of alternating dielectric material deposited on a metal line. Column two displays the area multiplier of that number of layers of alternating dielectric material given a 500 Å undercut. Column three gives the area multiplier associated with that number of layers given a 1000 Å undercut. The data in Table 1 is premised on an embodiment having vias with an area of one by one square micron and a depth of approximately one micron.

In an embodiment where there are 100 vias over a 20 micron by 20 micron area a planer capacitor (that is a capacitor having no vias) would have a capacitive area of 400 square microns. The capacitive area of the decoupling capacitor generated by hauling 100 one by one micron vias with a depth of one micron would be equal to 400 square microns plus the product of (four sides per via×one square micron per side× 100 vias) which would equal 800 square microns. In the embodiment where the vias are corrugated with for example, 10 layers of alternating interlayer dielectric material and a 1000 Å undercut, Table 1 discloses area multiplier for this embodiment of two. The total capacitive area available in this embodiment is calculated by adding 400 square microns from the planer capacitor to the product of (four sides per via×one square micron per side×the area enhancement factor of two× 100 vias) this product is 800 square microns which added to 400 square microns gives a total capacitive are available of 1200 square microns.

TABLE 1

| Number of layers | 500 Å undercut | 1000 Å undercut |
|---|---|---|
| 2 | 1.1 | 1.2 |
| 4 | 1.2 | 1.4 |
| 6 | 1.3 | 1.6 |
| 8 | 1.4 | 1.8 |
| 10 | 1.5 | 2.0 |
| 12 | 1.6 | 2.2 |
| 14 | 1.7 | 2.4 |
| 16 | 1.8 | 2.6 |
| 18 | 1.9 | 2.8 |
| 20 | 2.0 | 3.0 |

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   a device structure having a first metal layer:
   an electrically decoupling capacitor stack coupled to the first metal layer, the capacitor stack comprising a first electrode, a second electrode and a dielectric material disposed between the first electrode and the second electrode, wherein the first electrode is coupled through a via to a second metal layer superimposed over a portion of the first metal layer; and
   an interlayer dielectric layer coupled between the first metal layer and the second metal layer, wherein the interlayer dielectric comprises alternating layers of dissimilar dielectric material defining vertical corrugations in a wall of the via,
   wherein the decoupling capacitor stack conforms to the vertical corrugations.

2. The apparatus of claim 1, wherein the interlayer dielectric comprises alternating layers of silicon nitride and silicon oxide.

3. The apparatus of claim 1, wherein the decoupling capacitor stack contacts the first metal layer, the vertical corrugations in the via wall and a top portion of the interlayer dielectric layer in an area adjacent to the via.

4. The apparatus of claim 1, wherein the corrugated decoupling capacitor structure is supported by alternating layers of via metal material having dissimilar etch rates.

5. An apparatus comprising:
   a device structure having a first metal layer;
   an electrically decoupling capacitor stack coupled to the first metal layer having a top electrode, wherein the top electrode is coupled through a via to a second metal layer superimposed over a portion of the first metal layer; and
   an interlayer dielectric layer coupled between the first metal layer and the second metal layer, wherein the interlayer dielectric comprises alternating layers of dissimilar dielectric material defining vertical corrugations in a wall of the via,
   wherein the decoupling capacitor stack conforms to the vertical corrugations, and
   wherein the alternating layers of via metal material comprise a metal and a metal nitride system.

6. The apparatus of claim 5, wherein the metal comprises one of tantalum, titanium and tungsten.

* * * * *